United States Patent
Oh et al.

(10) Patent No.: US 10,043,682 B2
(45) Date of Patent: Aug. 7, 2018

(54) UNIT FOR SUPPLYING TREATMENT LIQUID AND APPARATUS FOR TREATING SUBSTRATE

(71) Applicant: Semes Co., Ltd., Cheonan-si, Chungcheongnam-do (KR)

(72) Inventors: Raetaek Oh, Cheonan-si (KR); Hyunwoo Lee, Incheon (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 0 days.

(21) Appl. No.: 15/196,653

(22) Filed: Jun. 29, 2016

(65) Prior Publication Data

US 2017/0018442 A1    Jan. 19, 2017

(30) Foreign Application Priority Data

Jul. 17, 2015    (KR) .................. 10-2015-0101770

(51) Int. Cl.
| | |
|---|---|
| *H01L 21/67* | (2006.01) |
| *B08B 3/08* | (2006.01) |
| *H01L 21/02* | (2006.01) |
| *B08B 15/00* | (2006.01) |
| *B08B 3/10* | (2006.01) |
| *B08B 3/14* | (2006.01) |
| *B08B 5/00* | (2006.01) |

(52) U.S. Cl.
CPC .. *H01L 21/67051* (2013.01); *H01L 21/02057* (2013.01); *H01L 21/67017* (2013.01)

(58) Field of Classification Search
CPC ......... H01L 21/67051; H01L 21/02057; H01L 21/67017
See application file for complete search history.

(56) References Cited

U.S. PATENT DOCUMENTS

| | | | | | |
|---|---|---|---|---|---|
| 4,569,695 | A | * | 2/1986 | Yamashita | .............. B08B 11/00 134/1 |
| 5,636,437 | A | * | 6/1997 | Kaschmitter | ........... H01M 4/13 264/29.1 |

(Continued)

FOREIGN PATENT DOCUMENTS

| | | |
|---|---|---|
| JP | 2005-210075 A | 8/2005 |
| JP | 2006-269677 A | 10/2006 |

(Continued)

OTHER PUBLICATIONS

Machine Translation of JP 2006269677 to Junichi et al., Oct. 2006.*

*Primary Examiner* — Michael Barr
*Assistant Examiner* — Benjamin L Osterhout
(74) *Attorney, Agent, or Firm* — Harness, Dickey & Pierce, P.L.C.

(57) ABSTRACT

Disclosed is an apparatus for treating a substrate. The apparatus includes a support unit that supports the substrate, and a treatment liquid supply unit that supplies a treatment liquid to the substrate, and the treatment liquid supply unit includes an injection unit that supplies the treatment liquid to the substrate supported by the support unit, a tank that accommodates the treatment liquid, a pipe connected to the tank, and a static electricity removing member that removes static electricity from the treatment liquid.

7 Claims, 8 Drawing Sheets

(56) References Cited

U.S. PATENT DOCUMENTS

| | | | | |
|---|---|---|---|---|
| 2003/0235041 | A1* | 12/2003 | Miyakawa | H01L 21/67356 361/752 |
| 2004/0125181 | A1* | 7/2004 | Nakamura | B41J 2/175 347/85 |
| 2004/0226654 | A1* | 11/2004 | Hongo | C25F 7/00 156/345.11 |
| 2005/0093182 | A1* | 5/2005 | Morita | B01F 3/0446 261/26 |
| 2008/0006302 | A1* | 1/2008 | Araki | H01L 21/0206 134/26 |
| 2011/0089580 | A1* | 4/2011 | Hawker | C08L 83/04 257/791 |
| 2014/0339321 | A1* | 11/2014 | Ryokawa | H01L 21/67017 239/1 |

FOREIGN PATENT DOCUMENTS

| | | |
|---|---|---|
| KR | 2007-0111982 A | 11/2007 |
| KR | 10-0830265 B1 | 5/2008 |
| KR | 2011-0080335 A | 7/2011 |
| KR | 10-1147656 B1 | 5/2012 |

\* cited by examiner

UNIT FOR SUPPLYING TREATMENT LIQUID AND APPARATUS FOR TREATING SUBSTRATE

CROSS-REFERENCE TO RELATED APPLICATIONS

A claim for priority under 35 U.S.C. § 119 is made to Korean Patent Application No. 10-2015-0101770 filed Jul. 17, 2015, in the Korean Intellectual Property Office, the entire contents of which are hereby incorporated by reference.

BACKGROUND

The inventive concept relates to a treatment liquid supply unit and a substrate treating apparatus including the same, and more particularly to a treatment supply unit and a substrate treating apparatus that remove static electricity from a treatment liquid.

Contaminants such as particles, organic contaminants, and metallic contaminants on a surface of a substrate greatly influences the characteristics and yield rate of a semiconductor device. Due to this, a cleaning process of removing various contaminants attached to a surface of a substrate is very important, and a process of cleaning a substrate is performed before and after unit processes for manufacturing a semiconductor.

In general, a process of cleaning a substrate includes a chemical treating process of removing metallic substances, organic substances, and particles residing on a substrate by using a treatment liquid such as a chemical, a rinsing process of removing the chemical residing on the substrate by using pure water, and a drying process of drying the substrate by using a drying gas.

Meanwhile, a treatment liquid stored in a tank circulates through a pipe connected to the tank, and while the treatment liquid circulates, static electricity due to friction is generated, and the static electricity is contained in the treatment liquid in the tank. However, if the treatment liquid containing static electricity is supplied to the substrate, the substrate may be damaged due to a spark or contaminated during the process.

SUMMARY

The inventive concept provides a treatment liquid supply unit and a substrate treating apparatus that remove static electricity contained in a treatment liquid from a substrate.

The aspect of the inventive concept is not limited thereto, and other unmentioned aspects of the inventive concept may be clearly appreciated by those skilled in the art from the following descriptions.

The inventive concept provides an apparatus for treating a substrate.

According to an embodiment, an apparatus for treating a substrate includes a support unit that supports the substrate, and a treatment liquid supply unit that supplies a treatment liquid to the substrate, and the treatment liquid supply unit includes an injection unit that supplies the treatment liquid to the substrate supported by the support unit, a tank that accommodates the treatment liquid, a pipe connected to the tank, and a static electricity removing member that removes static electricity from the treatment liquid.

According to an embodiment, the static electricity removing member may include a body of a conductive material that is immersed in the treatment in the tank, and the body may be grounded.

According to an embodiment, the pipe MAY include a circulation line that circulates the treatment liquid discharged from the tank, and the static electricity removing member MAY include a body of a conductive material that is provided at the circulation line, and the body is grounded.

According to an embodiment, one end of the body may be inserted into the interior of the circulation line and an opposite end of the body may protrude to the outside of the circulation line.

According to an embodiment, the pipe may include a circulation line that circulates the treatment liquid discharged from the tank, and a supply line that is branched from the circulation line to supply the treatment liquid discharged from the tank to the injection unit, and the static electricity removing member may include a body of a conductive material that is provided at the supply line, and the body is grounded.

According to an embodiment, one end of the body may be inserted into the interior of the supply line and an opposite end of the body may protrude to the outside of the supply line.

According to an embodiment, the body may have a rod shape.

According to an embodiment, the body may be formed of a material including a resin and carbon.

According to an embodiment, the mass content of carbon of the body may be more than 25% and less than 35%.

According to an embodiment, the treatment liquid supply unit may further include a temperature sensor that is provided to be immersed in the treatment liquid in the tank to measure a temperature of the treatment liquid, and wherein a lower end of the body is lower than a lower end of the temperature sensor.

According to an embodiment, the inventive concept provides a unit for supplying a treatment liquid.

According to an embodiment, a treatment liquid supply unit includes a tank that accommodates the treatment liquid, a pipe connected to the tank, and a static electricity removing member that removes static electricity from the treatment liquid.

According to an embodiment, the static electricity removing member may include a body of a conductive material that is immersed in the treatment liquid in the tank, and the body is grounded.

According to an embodiment, the pipe may include a circulation line that circulates the treatment liquid discharged from the tank, the static electricity removing member may include a body of a conductive material that is provided at the circulation line, and the body may be grounded.

According to an embodiment, the pipe may include a circulation line that circulates the treatment liquid discharged from the tank, and a supply line that is branched from the circulation line to supply the treatment liquid discharged from the tank to the outside, and the static electricity removing member may include a body of a conductive material that is provided at the supply line, and the body is grounded.

According to an embodiment, the body may have a rod shape.

According to an embodiment, the body may be formed of a material including a resin and carbon.

According to an embodiment, the mass content of carbon of the body may be more than 25% and less than 35%.

According to an embodiment, the treatment liquid supply unit may include a temperature sensor that is provided to be immersed in the treatment liquid in the tank to measure a temperature of the treatment liquid, and wherein a lower end of the body is lower than a lower end of the temperature sensor.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Hereinafter, exemplary embodiments of the inventive concept will be described with reference to FIGS. 1 to 4.

Figure 1:
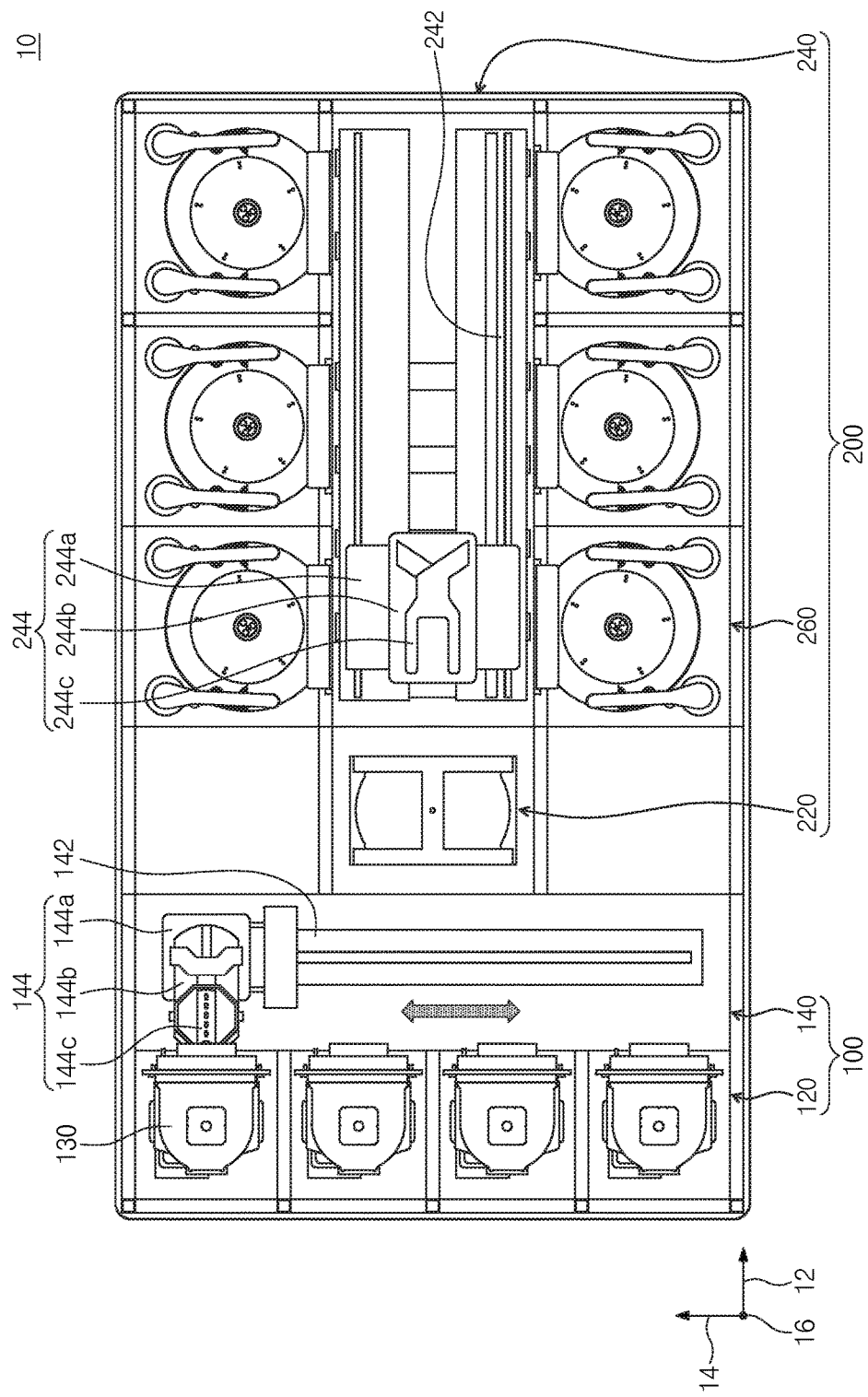
FIG. 1 is a plan view schematically illustrating a substrate treating facility provided with a substrate treating apparatus according to an embodiment of the inventive concept.

FIG. 1 is a plan view schematically illustrating a substrate treating system 1 according to the inventive concept.

Referring to FIG. 1, the substrate treating system 1 includes an index module 100 and a process executing module 200. The index module 100 includes a plurality of load ports 120 and a feeding frame 140. The load port 120, the feeding frame 140, and the process treating module 200 may be sequentially arranged in a row. Hereinafter, a direction in which the load port 120, the feeding frame 140, and the process treating module 200 are arranged will be referred to a first direction 12. A direction perpendicular to the first direction 12 when viewed from the top will be referred to as a second direction 14, and a direction normal to a plane including the first direction 12 and the second direction 14 will be referred to as a third direction 16.

A carrier 130, in which a substrate W is received, is seated on the load port 120. A plurality of load ports 120 are provided, and are arranged along the second direction 14 in a row. FIG. 1 illustrates that four load ports 120 are provided. However, the number of load ports 120 may increase or decrease according to a condition, such as the process efficiency of the process treating module 200 or a footprint. A plurality of slots (not illustrated) provided to support peripheries of substrates W are formed in the carrier 130. A plurality of slots are provided in the third direction 16. The substrates W are stacked in the carrier 130 while being spaced apart from each other along the third direction 16. A front opening unified pod (FOUP) may be used as the carrier 130.

The process treating module 200 includes a buffer unit 220, a feeding chamber 240, and a plurality of process chambers 260. The feeding chamber 240 is arranged such that the lengthwise direction thereof is in parallel to the first direction 12. The process chambers 260 are arranged on opposite sides of the feeding chamber 240 along the second direction 14. The process chambers 260 situated on one side of the feeding chamber 240 and the process chambers 260 situated on an opposite side of the feeding chamber 240 are symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chambers 260 having an array of A by B (A and B are natural numbers) may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is arranged between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 130 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 130 in the process executing module 200, and some of the index arms 144c may be used when the substrates W are transported from the carrier 130 to the process treating module 200. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is arranged such that the lengthwise direction thereof is in parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16. The main arms 244c used when the substrates W are transported from the buffer unit 220 to the process chambers 260 and the main arms 244 used when the substrates W are transported from the process chambers 260 to the buffer unit 220 may be different.

Substrate treating apparatuses 10 that perform cleaning processes on the substrates W are provided in the process chambers 260. The substrate treating apparatuses 10 provided in the process chambers 260 may have different structures according to the types of performed cleaning processes. Selectively, the substrate treating apparatuses 10 in the process chambers 260 may have the same structure. Selectively, the process chambers 260 may be classified into a plurality of groups such that the substrate treating apparatuses 10 provided in the process chambers 260 pertaining to the same group have the same structure and the substrate treating apparatuses 10 provided in the process chambers 260 pertaining to different groups have different structures. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of cleaning methods.

Figure 2:
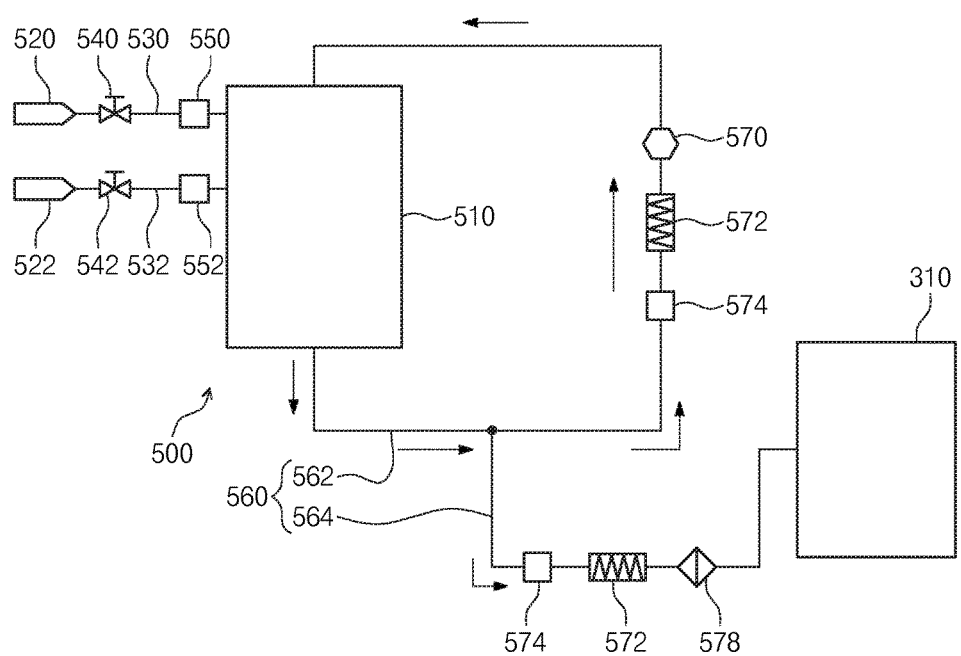
FIG. 2 is a view schematically illustrating a first embodiment of a substrate treating apparatus.
Figure 3:
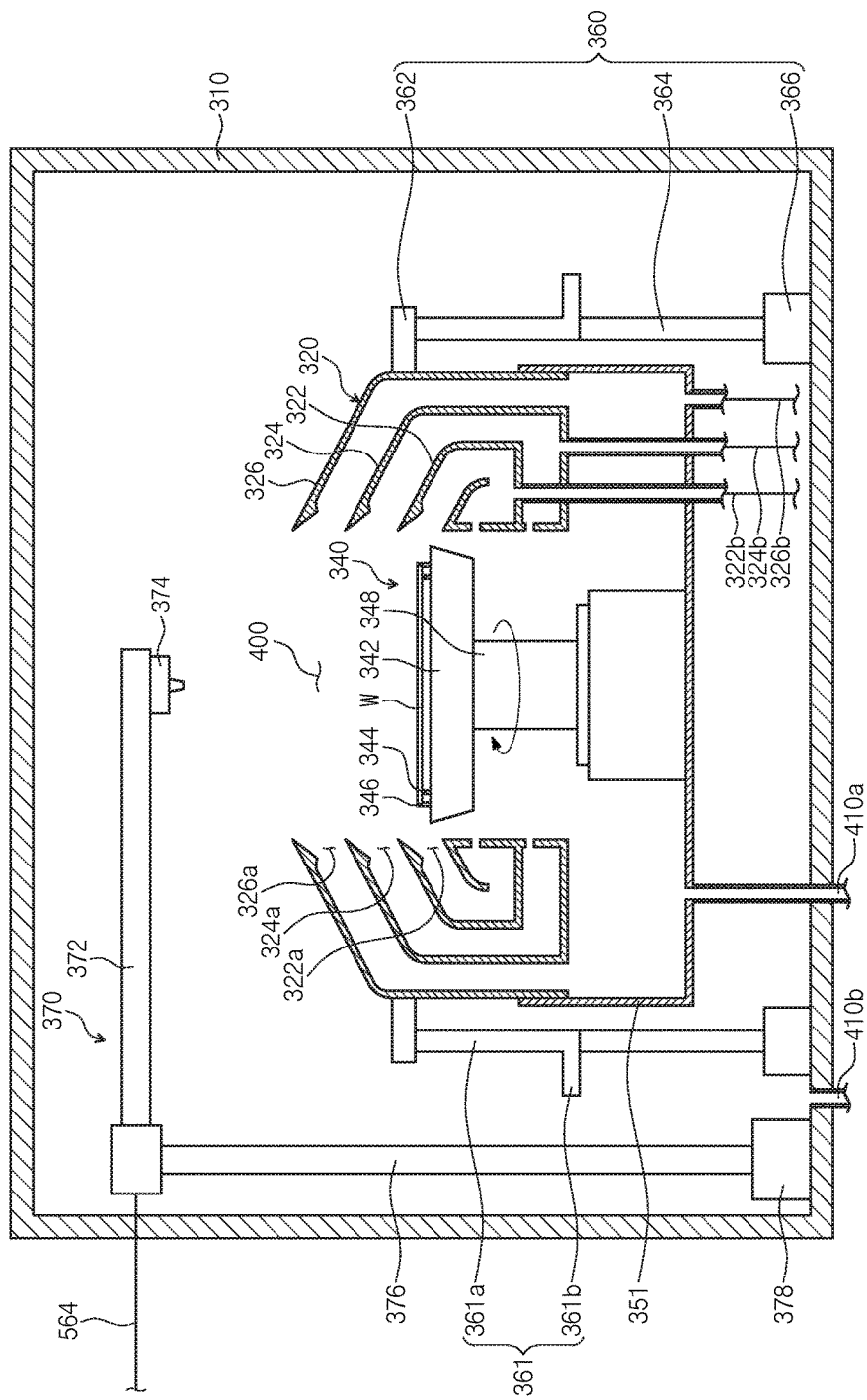
FIG. 3 is a view illustrating a chamber of FIG. 2.
Figure 4:
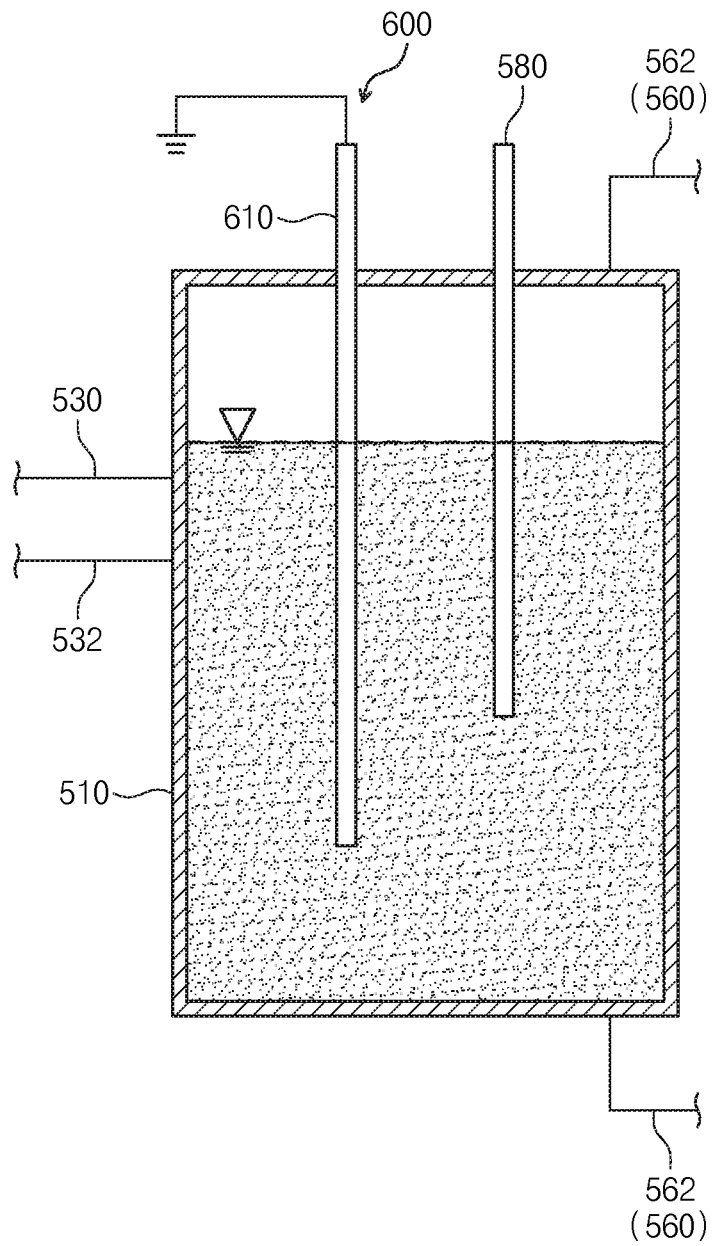
FIG. 4 is a view illustrating an static electricity removing member according to the first embodiment of the substrate treating apparatus of FIG. 2.

Hereinafter, an example of a substrate treating apparatus that treats a substrate W by using a treatment liquid will be described. FIG. 2 is a view schematically illustrating a first embodiment of a substrate treating apparatus. FIG. 3 is a view illustrating a chamber of FIG. 2. FIG. 4 is a view illustrating ar static electricity removing member according to the first embodiment of the substrate treating apparatus of FIG. 2.

Referring to FIGS. 2 and 3, the substrate treating apparatus 10 include a chamber 310, and a treatment liquid supply unit 500.

The chamber 310 includes a cup 320, a support unit 340, an injection unit 370, and an exhaust unit 410.

The chamber 310 provides a space in the interior thereof. A cup 320 is situated in the space in the chamber 310, and provides a treatment space 400 in which a substrate treating process is performed. The upper side of the treatment space 400 is opened.

The cup 320 has an inner recovery vessel 322, an intermediate recovery vessel 324, and an outer recovery vessel 326. The recovery vessels 322, 324, and 326 recover different treatment liquids used in the process. The inner recovery vessel 322 has an annular ring shape that surrounds the support unit 340, the intermediate recovery vessel 324 has an annular ring shape that surrounds the inner recovery vessel 322, and the outer recovery vessel has an annular ring shape that surrounds the intermediate recovery vessel 324. The entire cup 320 may be moved upwards and downwards, and the recovery vessels 322, 324, and 326 may be moved upwards and downwards independently. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets through which the treatment liquids are introduced into the inner recovery vessel 322, the intermediate recovery vessel 324, and the outer recovery vessel 326. Because the recovery vessels 322, 324, and 326 may be moved upwards and downwards independently, it may be such that when any one of the inner space 322a and the intermediate spaces 324a and 326a is opened, the remaining spaces may be closed.

Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment liquids introduced through the recovery vessels 322, 324, 326, respectively. The discharged treatment liquids may be reused through an external treatment liquid recycling system (not illustrated).

The support unit 340 is arranged in the cup 320. The support unit 340 supports and rotates the substrate W during the process. The support unit 340 includes a support plate 342, a plurality of support pins 344, a plurality of chuck pins 346, and a support shaft 348. The support plate 342 has an upper surface having a substantially circular shape when viewed from the top. The support shaft 348 that may be rotated by a motor 349 is fixedly coupled to the bottom of the support plate 342. A plurality of support pins 344 are provided. The support pins 344 may be arranged to be spaced apart from each other at a periphery of the upper surface of the support plate 342 and protrude upwards from the support plate 342. The support pins 334 are arranged to have a generally annular ring shape through combination thereof. The support pins 344 support a periphery of a rear surface of the substrate W such that the substrate W is spaced apart from the upper surface of the support plate 342 by a predetermined distance. A plurality of chuck pins 346 are provided. The chuck pins 346 are arranged to be more distant from the center of the support plate 342 than the support pins 344. The chuck pins 346 are provided to protrude upwards from the support plate 342. The chuck pins 346 support a side of the substrate W such that the substrate W is not separated laterally from a proper place when the support unit 340 is rotated. The chuck pins 346 are provided to be linearly moved between a standby position and a support position along a radial direction of the support plate 342. The standby position is a position that is more distant from the center of the support plate 342 than the support position. When the substrate W is loaded on or unloaded from the support unit 340, the chuck pins 346 are located at the standby position, and when a process is performed on the substrate W, the chuck pins 346 are located at the support position. The chuck pins 346 are in contact with the side of the substrate W at the support position.

The injection unit 370 supplies a treatment liquid to the substrate W during a substrate treating process. The treatment liquid includes a chemical, a rinsing liquid, and a drying fluid. The injection unit 370 has a nozzle support 372, a nozzle 374, a support shaft 376, and a driver 378. The lengthwise direction of the support shaft 376 is provided along the third direction 16, and the driver 378 is coupled to a lower end of the support shaft 378. The driver 378 rotates and elevates the support shaft 376. The nozzle support 372 is vertically coupled to an end opposite to an end of the support shaft 376 coupled to the driver 378. The nozzle 374 is installed on the bottom surface of an end of the nozzle support 372. The nozzle 374 is moved to a process location and a standby location by the driver 378. The process location is a location at which the nozzle 374 is arranged at a vertical upper portion of the cup 320, and the standby location is a location that deviates from the vertical upper portion of the cup 320. The nozzle may include a treatment liquid nozzle that injects a treatment liquid, a rinsing liquid that injects a rinsing liquid, and a drying nozzle that injects a drying fluid. The treatment liquid may be a chemical. The rinsing liquid may be pure water. The drying fluid may be a mixture of isopropyl alcohol vapor, alcohol vapor, and an inert gas, or an isopropyl alcohol liquid.

The exhaust unit 410 exhausts foreign substances, such as, fume generated during the substrate treating process and the treatment liquid through air flows. The exhaust unit 410 has a first exhaust member 410a and a second exhaust member 410b. The first exhaust member 410a exhausts fluids from the interior of the treatment space 400 of the cup 320. The first exhaust member 410a is connected to the bottom surface of the cup 320. The second exhaust member 410b exhausts fluids from a space between the cup 320 and the chamber 310. The second exhaust member 410b is connected to the bottom surface of the chamber 310.

The treatment liquid supply unit 500 supplies the treatment liquid into the chamber 310. The treatment liquid supply unit 500 includes a tank 510, a pure water supply unit 520, a chemical supply unit 522, a pure water supply line 530, a chemical supply line 532, a first valve 540, a second valve 542, a first flow rate gauge 550, a second flow rate gauge 552, a pipe 560, a concentration measuring member 570, a heater 572, a pump 574, a filter 578, a temperature sensor 580, and a static electricity removing member 600.

The tank 510 stores a treatment liquid that is to be supplied into the chamber 310. The pure water supply unit 520 supplies pure water into the tank 510 through the pure water supply line 530. The pure water supply unit 520 adjusts the concentration of the treatment liquid. The first valve 540 is provided in the pure water supply line 530. The first valve 540 controls flows of pure water. The first flow rate gauge 550 is provided in the pure water supply line 530. The first flow rate gauge 550 measures a flow rate of pure water supplied to the tank 510, and properly controls the amount of supplied pure water. The chemical supply unit 522 supplies a chemical into the tank 510 through the chemical supply line 532. The second valve 542 is provided in the chemical supply line 532. The second valve 542 controls flows of a chemical. The second flow rate gauge 552 is provided in the chemical supply line 532. The second flow rate gauge 552 measures a flow rate of a chemical supplied to the tank 510, and properly controls the amount of the supplied chemical.

The pipe 560 is connected to the tank 510. A treatment liquid flows through the interior of the pipe 560. The pipe 560 may include a circulation line 562 and a supply line 564. The both end of circulation line 562 is connected to the tank 510. The circulation line 562 circulates the treatment liquid. The supply line 564 is branched from the circulation line 562. The supply line 564 supplies the treatment liquid to the injection unit 370 of the chamber 310.

The concentration measuring member 570 measures a concentration of the treatment liquid. The concentration measuring member 570 may be provided on the pipe 560. The concentration measuring member 570 may be provided on the circulation line 562.

The heater 572 heats the treatment liquid. The heater 572 controls the temperature of the treatment liquid. The heater 572 may be provided on the pipe 560. The heater 572 may be provided on the pipe 560.

The pump 574 provides power such that the treatment liquid flows. The pump 574 may be provided on the pipe 560.

The filter 578 removes impurities contained in the treatment liquid. The filter 578 may be provided on the pipe 560.

The temperature sensor 580 measures the temperature of the treatment liquid in the tank 510. The temperature sensor 580 is provided to be immersed in the treatment liquid in the tank 510.

The static electricity removing member 600 discharges static electricity contained in the treatment liquid to the outside to remove the static electricity. The static electricity may correspond to negative charges or positive charges. The static electricity removing member 600 may include a body 610 immersed in the treatment liquid in the tank 510. The body 610 is grounded. The body 610 may be formed of a conductive material. The body 610 may be formed of a material including a resin and carbon. The resin may be a Teflon-based resin. The resin may be a material including a per fluoro alcoxide resin (PFA). The resin is not conductive, but the carbon is conductive. Accordingly, static electricity may be removed from the treatment liquid in the tank 510. The body 610 may contain a mass content of carbon of not less than 25% and not more than 35%. Preferably, the mass content of carbon may be not less than 28% and not more than 32%. In Table 1, static electricity removing effects according to the mass contents of carbon of the body 610 including a per fluoro alcoxide resin (PFA) and carbon are compared.

TABLE 1

|  | Content of carbon of 0% | Content of carbon of 10% | Content of carbon of 20% | Content of carbon of 30% |
| --- | --- | --- | --- | --- |
| Before removal of static electricity | −7.39 kV | −7.39 kV | −7.39 kV | −7.39 kV |
| After removal of static electricity | −7.39 kV | −5.25 kV | −3.04 kV | +0.00 kV |

As in Table 1, as the mass content of carbon of the body 610 increases from 0%, the amount of removed static electricity increases, and when the mass content is 30%, most of the static electricity of the treatment liquid is removed. When the carbon corresponding to not more than the mass content of 30%, the body 610 may be corroded or damaged.

Referring to FIG. 4, a lower end of the body 610 is provided at a location lower than that of a lower end of the temperature sensor 580. If the treatment liquid in the tank 510 is discharged such that the water level of the treatment liquid is lowered, the surface of the treatment liquid and the lower end of the temperature sensor 580 contact each other. Then, a spark is generated by static electricity. Accordingly, due to the spark, the temperature sensor 580 is damaged. If the lower end of the body 610 is lower than the lower end of the temperature sensor 580, a spark is not generated even though the water surface of the treatment liquid and the lower end of the temperature sensor 580 contact each other. Accordingly, damage to the temperature sensor 580 may be prevented.

Hereinafter, a substrate treating process according to a first embodiment of the inventive concept will be described with reference to FIGS. 2 to 4. The arrows indicate flows of the treatment liquid.

The treatment liquid that treats a substrate is stored in the tank 510. Pure water is supplied from the pure water supply unit 520 to the tank 510, and a chemical is supplied from the chemical supply unit 522. The first valve 540 and the first flow rate gauge 550 are provided in the pure water supply line 530 to control supply of pure water. The second valve 542 and the second flow rate gauge 552 are provided in the chemical supply line 532 to control supply of the chemical. The treatment liquid flows through the circulation line 562 that circulates the treatment liquid discharged from the tank 510. It may be detected whether the treatment liquid maintains a set concentration through the concentration measuring member 570 provided in the circulation line 562. If the concentration of the treatment liquid is lower than the set concentration, the chemical is supplied from the chemical supply unit 522 to the tank 510. If the concentration of the treatment liquid is higher than the set concentration, the pure water is supplied from the pure water supply unit 520 to the tank 510. The treatment liquid may be heated through the heater 572 provided in the circulation line 562. It is identified whether the temperature of the treatment liquid maintains a set temperature, through the temperature sensor 580. If the temperature of the treatment liquid is lower than the set temperature, the heater 572 heats the treatment liquid. The treatment liquid may be circulated through the pump 574 provided in the circulation line 562. The impurities contained in the treatment liquid may be removed through the filter 578 provided in the circulation line 562. The heater 572, the pump 574, and the filter 578 may be provided in the supply line 564.

The static electricity removing member 600 is provided in the treatment liquid in the tank 510. The static electricity removing member 600 includes a body 610. The body 610 is provided to be immersed in the treatment liquid in the tank 510. The body 610 is formed of a conductive material. The body 610 is grounded. Accordingly, the static electricity of the treatment liquid is discharged through the body 610. As described above, the body 610 may include a resin and carbon. The body 610 may contain a mass content of carbon of not less than 25% and not more than 35%. The treatment liquid in the tank 510 circulates along a pipe. Static electricity is continuously generated while the treatment liquid circulates. The static electricity is continuously removed through the body 610 immersed in the treatment liquid. A portion of the treatment liquid, from which static electricity has been removed, is provided to the injection unit 370 through the supply line 564 branched from the circulation line 562. The treatment liquid provided to the injection unit 370 is supplied to the substrate to treat the substrate.

Although it has been described in the aforementioned embodiment that the supply line is included, the supply line may be omitted.

Figure 5:
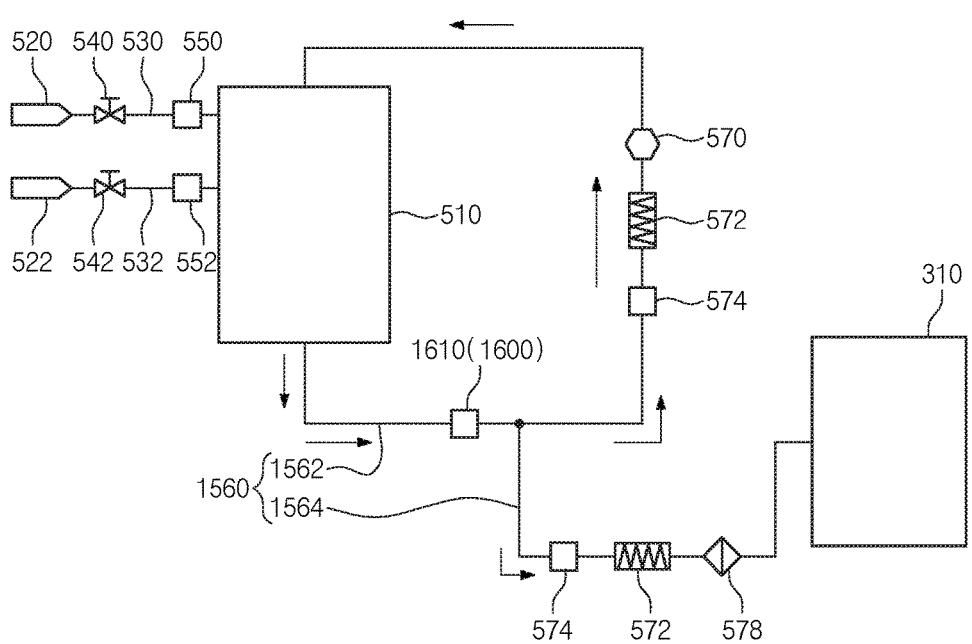
FIGS. 5 and 6 are views schematically illustrating the substrate treating apparatus of FIG. 2 according to a second embodiment of the inventive concept.
Figure 6:
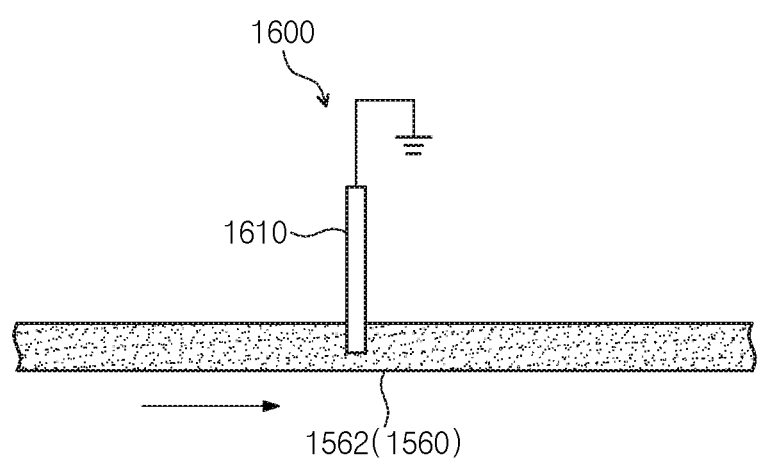

FIGS. 5 and 6 are views schematically illustrating a substrate treating apparatus 20 according to a second embodiment of the inventive concept. Although it has been described in the aforementioned embodiment that the body 610 of the static electricity removing member 600 is immersed in the treatment liquid in the tank 510, a body 1610 may be provided in a pipe 1560. In detail, the pipe 1560 may include a circulation line 1562 that circulates the treatment liquid discharged from a tank 510, and the body 1610 may be provided in the circulation line 1562. Referring to FIG. 6, one end of the body 1610 is inserted into the interior of the circulation line 1562, and an opposite end of the body 1610 may protrude to the outside of the circulation line 1562. The body 1610 is grounded. The body 1610 may be formed of a conductive material including a resin and carbon. Accordingly, static electricity contained in the treatment liquid flowing through the circulation line 1562 is removed through the body 1610. A portion of the treatment liquid, from which static electricity has been removed, is provided to the injection unit 370 of the chamber 310. The treatment liquid provided to the injection unit 370 is supplied to the substrate to treat the substrate.

Figure 7:
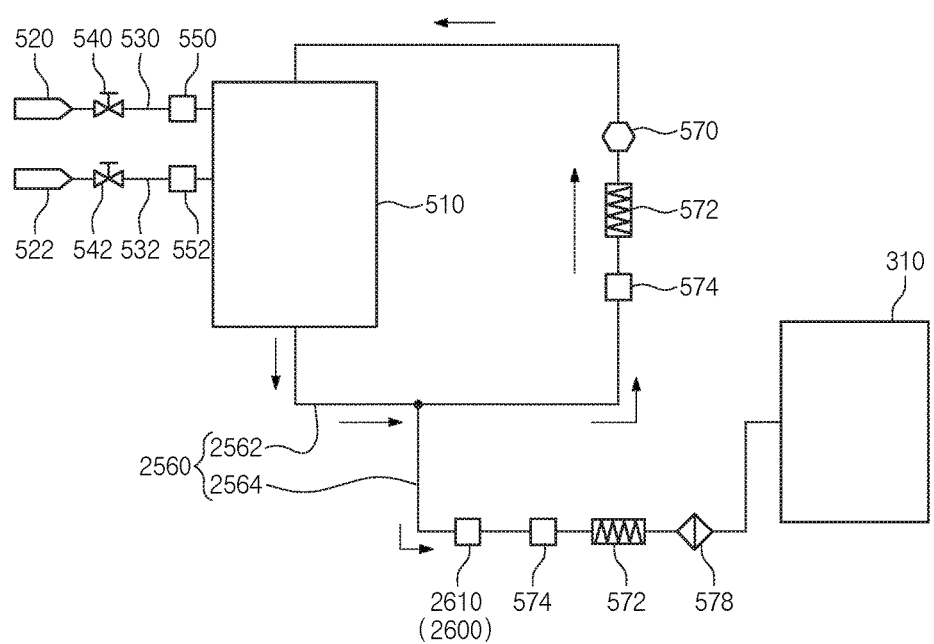
FIGS. 7 and 8 are views schematically illustrating the substrate treating apparatus of FIG. 2 according to a third embodiment of the inventive concept.
Figure 8:
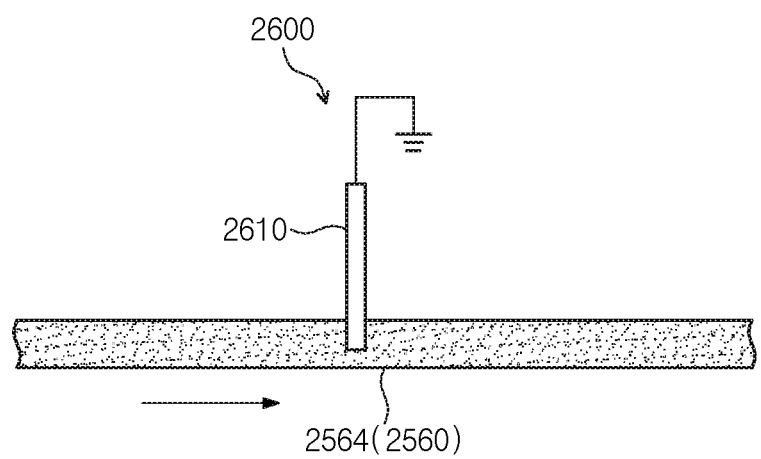

FIGS. 7 and 8 are views schematically illustrating a substrate treating apparatus 30 according to a third embodiment of the inventive concept. Although it has been described in the aforementioned embodiments that the body 610 of the static electricity removing member 600 is immersed in the treatment liquid in the tank 510 or is provided in the circulation line 1562, a body 2610 of a static electricity removing member 2600 may be provided in a supply line 2564. In detail, the pipe 2560 may include a circulation line 2562 and a supply line 2564. The circulation line 2562 circulates the treatment liquid discharged from the tank 510. The supply line 2564 is branched from the circulation line 2562 and provides the treatment liquid to the injection unit 370 of the chamber 310. Referring to FIG. 8, one end of the body 2610 is inserted into the interior of the supply line 2564, and an opposite end of the body 1610 may protrude to the outside of the supply line 2564. The body 2610 is grounded. The body 2610 may be formed of a conductive material including a resin and carbon. Accordingly, static electricity contained in the treatment liquid flowing through the supply line 2564 is removed through the body 2610. The treatment liquid, from which static electricity has been removed, is provided to the injection unit 370. The treatment liquid provided to the injection unit 370 is supplied to the substrate to treat the substrate.

Although not illustrated, unlike the aforementioned embodiments, the treatment liquid supply unit may not include a separate static electricity removing member such as a body. The role of the static electricity removing member of the aforementioned embodiment may be performed by a tank. The static electricity of the treatment liquid may be removed through the tank. The tank that accommodates the treatment liquid is formed of a conductive material such that the tank is grounded. The tank may be formed of a material including a resin and carbon. The mass content of carbon of the tank may be not less than 25% and not more than 35%. The static electricity contained in the treatment liquid is removed through the tank.

Although not illustrated, unlike the aforementioned embodiments, the tank may include a plurality of tanks such as a first tank and a second tank. Then, the treatment liquid stored in the tanks may be sequentially supplied to the injection unit. For example, if the treatment liquid stored in the first tank is completely supplied to the injection unit, the treatment liquid stored in the second tank may be supplied to the injection unit. Further, static electricity may be removed from the treatment liquid by the bodies of the embodiments. Further, the first tank and the second tank may be formed of a conductive material to be grounded while a separate body is not provided so that static electricity may be removed from the treatment liquid.

According to an embodiment of the inventive concept, static electricity contained in a treatment liquid may be removed.

Further, according to an embodiment of the inventive concept, a spark that may be generated on a surface of a substrate and damage to the substrate may be prevented.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A treatment liquid supply unit that supplies a treatment liquid to a substrate, the treatment liquid supply unit comprising:

a tank configured to accommodate the treatment liquid;
   a pipe connected to the tank; and
   a static electricity removing member configured to removed static electricity from the treatment liquid; and
   a temperature sensor that is provided to be immersed in the treatment liquid in the tank to measure a temperature of the treatment liquid, and
   wherein a lower end of the static electricity removing member is lower than a lower end of the temperature sensor.

2. The treatment liquid supply unit of claim 1, wherein the static electricity removing member comprises a body of a conductive material that is immersed in the treatment liquid in the tank, and the body is grounded.

3. The treatment liquid supply unit of claim 1, wherein the pipe comprises:

a circulation line configured to circulate the treatment liquid discharged from the tank, and
   wherein the static electricity removing member comprises a body of a conductive material that is provided at the circulation line, and the body is grounded.

4. The treatment liquid supply unit of claim 1, wherein the pipe comprises:

a circulation line configured to circulate the treatment liquid discharged from the tank; and
   a supply line that is branched from the circulation line to supply the treatment liquid discharged from the tank to the outside, and
   wherein the static electricity removing member comprises a body of a conductive material that is provided at the supply line, and the body is grounded.

5. The treatment liquid supply unit of claim 1, wherein the static electricity removing member includes a body, and the body has a rod shape.

6. The treatment liquid supply unit of claim 1, wherein the static electricity removing member includes a body, and the body is formed of a material comprising a resin and carbon.

7. The treatment liquid supply unit of claim 6, wherein a mass content of carbon of the body is more than 25% and less than 35%.

* * * * *